United States Patent [19]
Bertin et al.

[11] Patent Number: 5,761,114
[45] Date of Patent: Jun. 2, 1998

[54] MULTI-LEVEL STORAGE GAIN CELL WITH STEPLINE

[75] Inventors: Claude L. Bertin, South Burlington; John A. Fifield, Underhill; Russell J. Houghton, Essex Junction; Christopher P. Miller, Underhill; William R. Tonti, Essex Junction, all of Vt.

[73] Assignee: International Business Machines Corporation, Armonk, N.Y.

[21] Appl. No.: 803,034

[22] Filed: Feb. 19, 1997

[51] Int. Cl.$^6$ .................................................. G11C 11/56
[52] U.S. Cl. ........................................... 365/168; 365/149
[58] Field of Search ................................. 365/168, 149, 365/206

[56] References Cited

U.S. PATENT DOCUMENTS

| | | | |
|---|---|---|---|
| 4,661,929 | 4/1987 | Aoki et al. | 365/149 |
| 4,669,062 | 5/1987 | Nakano | 365/174 |
| 4,709,350 | 11/1987 | Nakagome | 365/184 |
| 4,719,600 | 1/1988 | Huffman et al. | 365/208 |
| 5,060,194 | 10/1991 | Sakui et al. | 365/177 |
| 5,218,569 | 6/1993 | Banks | 365/189.01 |
| 5,283,761 | 2/1994 | Gillingha | 365/189.07 |
| 5,293,563 | 3/1994 | Ohta | 365/190 |
| 5,343,555 | 8/1994 | Yayla et al. | 395/24 |
| 5,351,210 | 9/1994 | Saito | 365/189.01 |
| 5,459,686 | 10/1995 | Saito | 365/149 |
| 5,463,234 | 10/1995 | Toriumi et al. | 257/296 |

OTHER PUBLICATIONS

Technical article "A 768k Embedded DRAM for 1.244Gb/s ATM Switch in a 0.8um Logic Process" by Gillingham, et al., 16th Session IEEE International Solid–State Circuits Conference, 1996, pp. 262–263.

Technical article "Implementing Application Specific Memory" by Foss, 16th Session IEEE International Solid–State Circuits Conference, 1996, pp. 260–261.

Primary Examiner—A. Zarabian
Attorney, Agent, or Firm—Schmeiser, Olsen & Watts; Robert A. Walsh

[57] ABSTRACT

A method and apparatus for using multi-level signals in a gain cell is shown. The method involves of first, storing a value of a multi-level signal in the gain cell. A stepping waveform is then applied to the gain cell and the gain cell outputs a conduction signal when the level of the stepping waveform corresponds to the value of the multilevel signal that is stored within the gain cell. Finally, the value of the multi-level signal is determined through the conduction signal and the corresponding level of the stepping waveform. The gain cell includes an input device, a storage device and a level comparator, which responds to the stepping waveform generated from a stepping signal generator and outputs the conduction signal for determining the value of the multi-level signal stored in the storage device.

20 Claims, 3 Drawing Sheets

5,761,114

MULTI-LEVEL STORAGE GAIN CELL WITH STEPLINE

RELATED APPLICATION

This application is a sister application to "Gain Memory Cell with Diode", by Houghton et al., assigned to the assignee of record and filed concurrently herewith.

BACKGROUND OF THE INVENTION

1. Technical Field

The invention relates generally to semiconductor gain memory cells, and more specifically, to methods for multi-level store in semiconductor gain memory cells.

2. Background Art

Semiconductor memories, specifically dynamic random access memories (DRAMs), have been integrating both logic functions and memory, or "logic in memory", on a single chip in order to achieve sufficient cost and performance benefits for use. This is made possible through the use of small, reliable planar cells, such as the planar two-transistor DRAM cell employing a dynamic gain (gain cell).

Some examples of gain-type DRAM cells are found in the following U.S. Patents and articles: U.S. Pat. No. 5,463,234, "High Speed Semiconductor Gain Memory Cell with Minimal Area Occupancy", issued October 1995 to Toriumi et al.; U.S. Pat. No. 4,669,062, "Two-Tiered Dynamic Random Access Memory (DRAM) Cell", issued May 1987 to Nakano; and technical articles "Implementing Application Specific Memory" by Foss, and "A 768 k Embedded DRAM for 1.244 Gb/s ATM Switch in a 0.8 um Logic Process" by Gillingham et al., both articles from 16th Session IEEE International Solid-State Circuits Conference, 1996, pp. 260–261, and 262–263, respectively. As disclosed, the integrated memory and logic further increased the density of DRAMs making it possible for designers to not have to rely upon SRAM for on-chip memory. Nonetheless, the above-mentioned patents and articles do not disclose a method of incorporating multi-level stores or multistepping functions for the gain cells in DRAMs. In fact, previous multi-level store memory cells have relied upon the sensing of each level through the division, or partitioning of the stored voltage level, and in conventional DRAMs, the partitioning of the stored voltage level has produced unreliable signal levels, noise, and/or long wait times.

Accordingly, a need has developed in the art for a multi-level storage memory cell with high sense voltages.

SUMMARY OF THE INVENTION

It is thus an advantage of the present invention to provide a multi-level storage memory cell with high sense voltages.

The foregoing and other advantages of the invention are realized by a method and multi-level storage memory system for multi-level store in a gain cell. First, a value of a multi-level signal is stored in the gain cell. A stepping waveform is then applied to the gain cell and the gain cell outputs a conduction signal when the level of the stepping waveform corresponds to the value of the multi-level signal that is stored within the gain cell. Finally, the value of the multi-level signal is determined through the conduction signal and the corresponding level of the stepping waveform. The gain cell includes an input device, a storage device and a level comparator and amplifier, which responds to the stepping waveform generated from a stepping signal generator and outputs the conduction signal for determining the value of the multi-level signal stored in the storage device.

The foregoing and other advantages and features of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements, and.

DETAILED DESCRIPTION OF THE DRAWINGS

Figure 1:
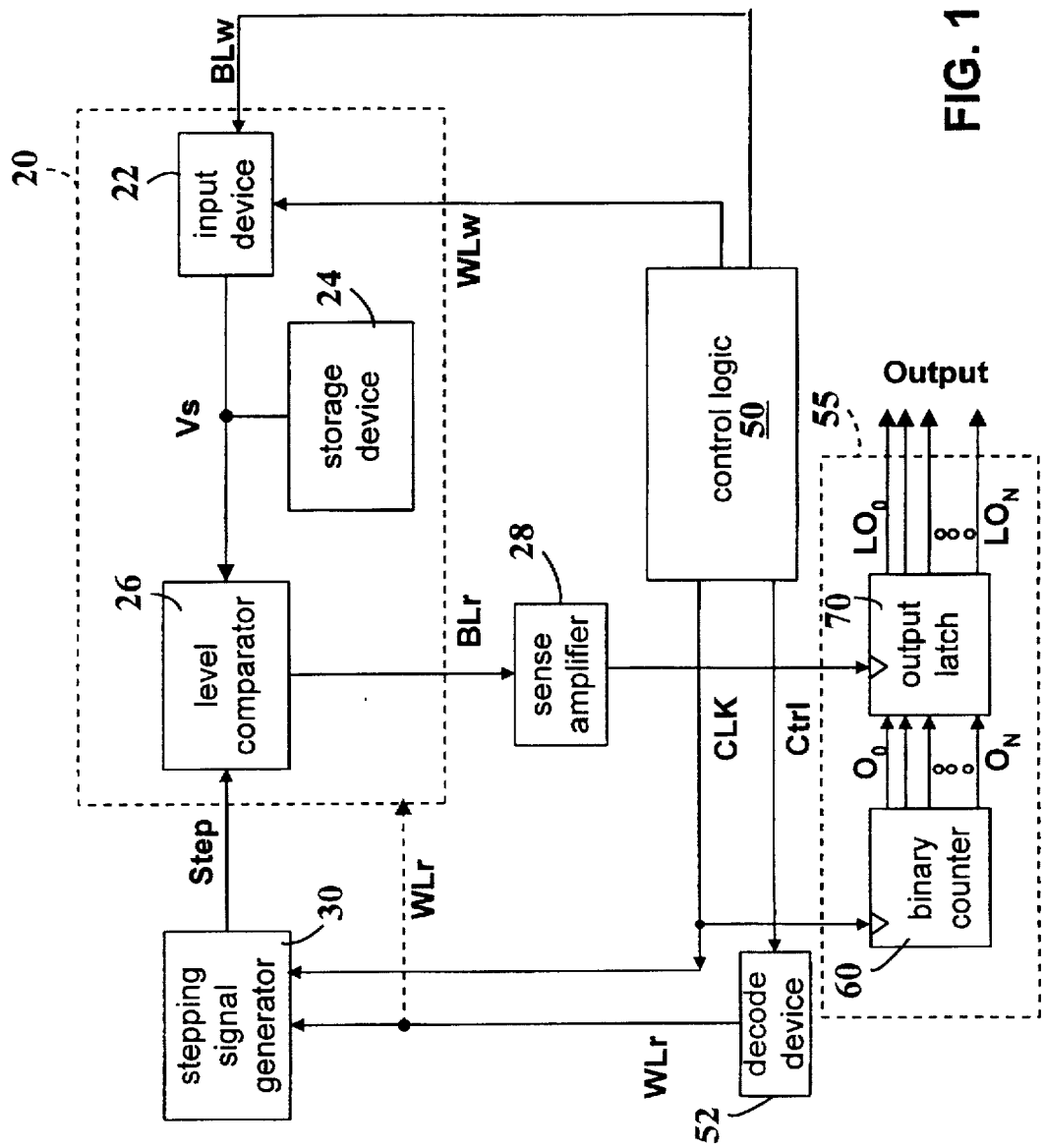
FIG. 1 is a block diagram of a semiconductor memory system in accordance with a preferred embodiment of the present invention.

Referring to FIG. 1, a semiconductor memory system 10 in accordance with the present invention, including a gain cell 20, stepping signal generator 30, sense amplifier 28, control logic 50, decode device 52, and output device 55 is disclosed. Output device 55 comprises binary counter 60 and output latch 70, although other elements with similar performance capabilities, such as an analog-to-digital (A/D) converter that receives a stepping waveform from stepping signal generator 30, may also be used. Gain cell 20 comprises input device 22, storage device 24 and level comparator 26. Input device 22 is coupled to control logic 50 and storage device 24. Level comparator 26 is coupled to storage device 24, to stepping signal generator 30, and to sense amplifier 28. Stepping signal generator 30 receives a CLK input from control logic 50; and decoded wordline read signal, WLr from control logic via decode device 52. WLr may also feed into gain cell 20 as will be discussed below in reference to FIG. 2. Binary counter 60 receives CLK as an input, and outputs $O_0$–$O_N$ to output latch 70. Outputs $LO_0$–$LO_N$ are outputted by output latch 70 when clocked by sense amplifier 28.

For a write operation, input device 22 receives write data, via wordline (WLw) and bitline (BLw), from control logic 50. As aforementioned, the write data may comprise multi-level signals, wherein BLw is driven to a specified voltage value corresponding to the binary code to be stored. WLw enables input device 22, thus allowing the value of BLw to be gated through to storage device 24.

For a read operation, stepping signal generator 30 produces a control signal STEP that periodically either increments or decrements through CLK. One example of a stepping signal generator 30 may be a counter coupled to a digital-to-analog converter, although generator 30 is not limited to such. The number of increments/decrements, or steps, correspond to the amount of levels of the multi-level signal. When STEP reaches a level that corresponds with the value of the signal stored within storage device 24, level comparator conducts and amplifies a conduction signal on BLr, which is inputted into sense amplifier 28. The single-ended sense amplifier 28, in turn, amplifies the conduction signal and outputs a senseamp signal that clocks output latch 70, allowing the output ($O_0$–$O_N$) of binary counter 60 to be latched. The value outputted from output latch 70 ($LO_0$–$LO_N$) corresponds to the value of the stored multi-level signal. The value of the stored multi-level signal is thus time decoded and determined by the corresponding level of the stepping waveform without having to sense small and unreliable signal levels derived by the division of the stored voltage level.

Thus, a value of a multi-level signal is stored in the gain cell. A stepping waveform is applied to the gain cell and the gain cell outputs a conduction signal when the level of the stepping waveform corresponds to the value of the multi-level signal that is stored within the gain cell. Finally, the value of the multi-level signal is determined through the conduction signal and the corresponding level of the stepping waveform. That is, a correlation of the signal change to a step value or pulse count determines the value stored in the multi-level gain cell. Two specific embodiments of the gain cell 20 and its methods of operation will be discussed in greater detail below in reference to FIGS. 2–5.

Figure 2:
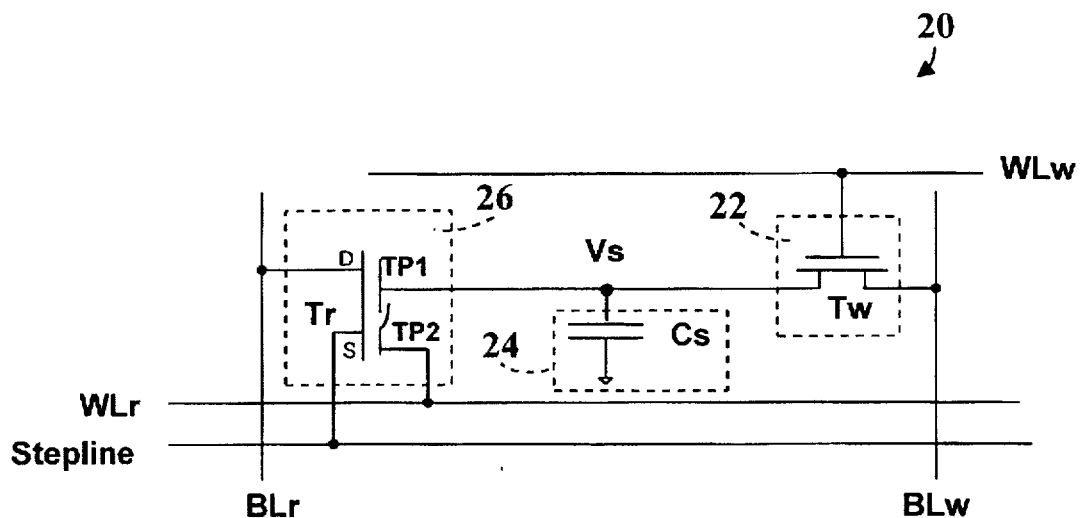
FIG. 2 is a first embodiment of the gain cell of FIG. 1.

FIG. 2 illustrates a first embodiment of gain cell 20 of FIG. 1. As can be seen in FIG. 2, the gain cell is a two and one-half device gain cell having a split channel field-effect transistor (FET) Tr. In this embodiment, input device 22 is an FET Tw, such as an n-channel FET. The source of Tw is tied to control logic 50 (FIG. 1) through BLw and the drain is tied to storage device 24. The gate of Tw is tied to control logic 50 through WLw. Thus, for a write operation, the value of BLw is written into storage device 24 when WLw is driven high. Storage device 24 is a capacitor Cs, having one element tied to AC ground. Voltage Vs is stored on capacitor Cs. The level comparator 26 in this embodiment is a dual gate split channel FET Tr with the source of Tr tied to stepping generator 30 (FIG. 1) through the decoded stepline as is decoded from decode device 52 (FIG. 1). The drain of Tr is tied to the sense amplifier 28 (FIG. 1) through the BLr line. Gate TP1 is tied to Vs, and gate TP2 is tied to the decoded WLr line to enable the output of the conduction signal.

A read operation is performed when WLr is driven high and the step function STEP is applied to the stepline. In this embodiment, STEP and WLr are required to uniquely select an array gain cell. BLr to stepline conduction will occur when the voltage of STEP (Vstep) is less than to Vs minus the threshold voltage (Vth), that is, when Vstep<Vs−Vth. When both gates of Tr are activated, conduction occurs and the value of the multi-level signal is determined through the conduction signal and the corresponding level of the stepping waveform. The split channel FET prevents a loss of voltage at Vs during a read operation. Thus, the first embodiment of the invention not only provides a dense memory cell that uses FET technology, but also provides nondestructive read out (NDRO) for that memory cell. No writeback/regeneration cycle is necessary, allowing for a faster cycle time than other gain cell embodiments.

Figure 3:
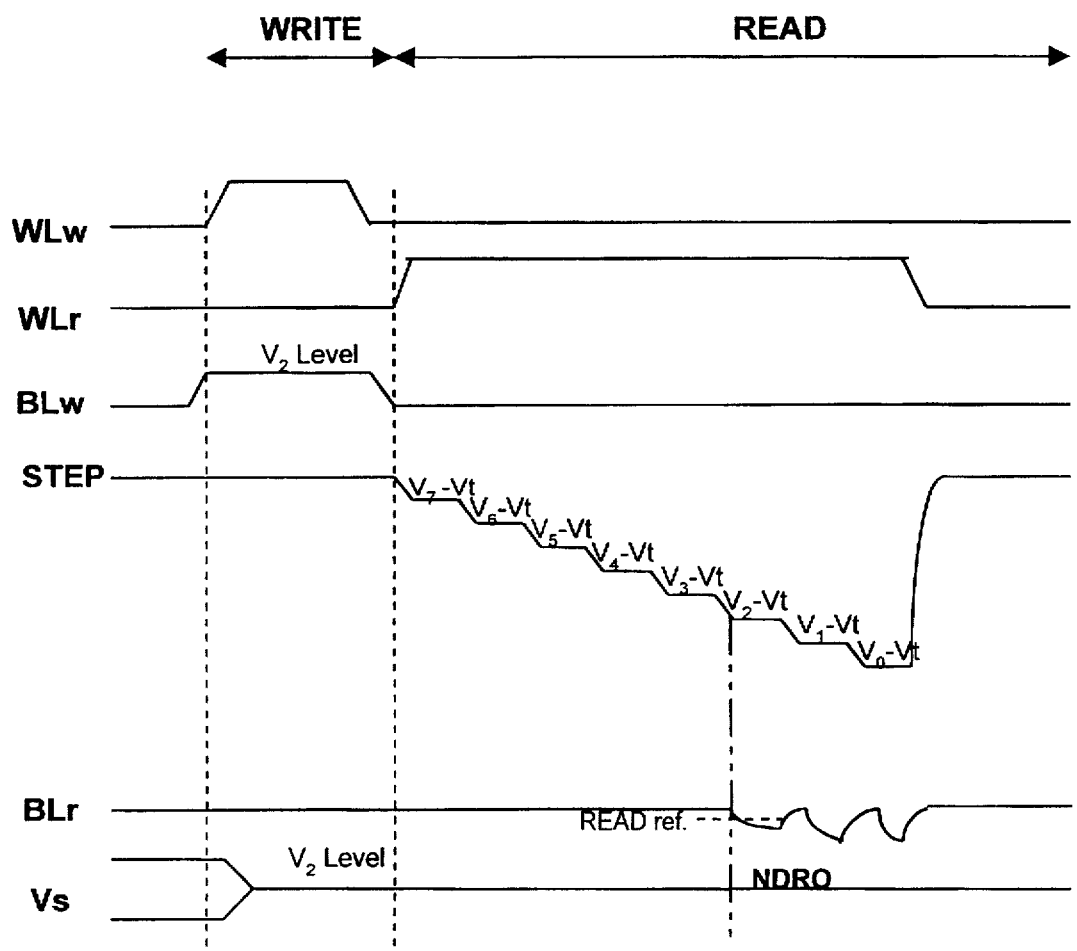
FIG. 3 is a timing diagram corresponding to FIG. 2.

FIG. 3 illustrates the operational waveforms of FIG. 2 during the read and write operations. As aforementioned, for a write operation, WLw is driven high and the analog BLw is written onto node Vs. In this example, the value written onto node Vs is at a "2" level. Gate TP2 is off when WLr is held at ground. During the read operation, WLr activates gate TP2 and the voltage drops (or the current flows) on BLr beginning when Vstep<Vs−Vth. The conduction signal is thus sent to the single-ended sense amplifier 28 (FIG. 1). There is no need for a writeback/regeneration cycle after the read operation since level Vs is not altered by the read operation.

Figure 4:
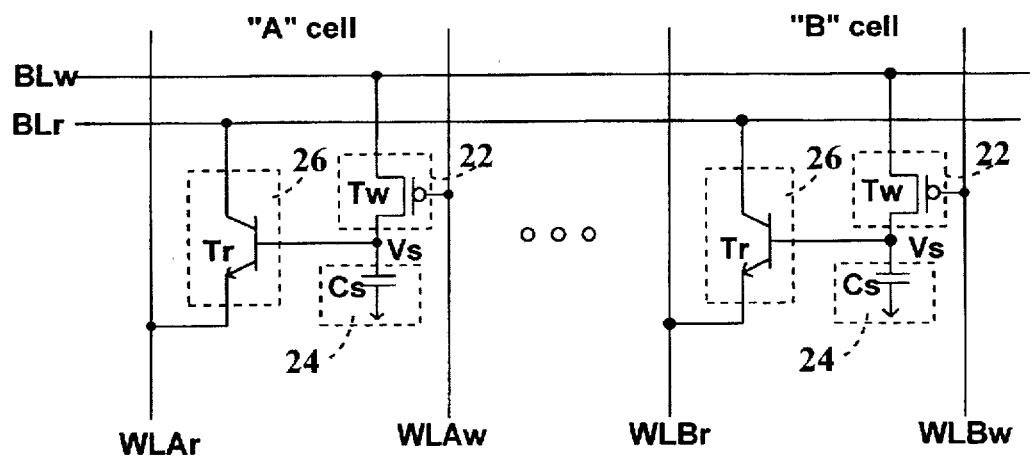
FIG. 4 is a second embodiment of the gain cell of FIG. 1.

As seen in FIG. 4, a second embodiment of gain cell 20 is disclosed. The input device 22 of this embodiment is a p-channel FET Tw, although an n-channel FET may also be used. The storage device 24, as in the first embodiment, is a capacitor Cs, and level comparator 26 is a bipolar transistor Tr. In this embodiment, two separate instances of the invention are shown, each having its own wordlines (WLAr, WLAw and WLBr, and WLBw), but sharing common BLr and BLw lines. An advantage of using a bipolar device as the level comparator is that the bipolar device allows for a very fast access time, even though the cycle time may be slower than the previous embodiment because of the necessity of a writeback/regeneration cycle as discussed below. The bipolar device also provides substantial gain by Beta multiplication of the charged drain from Vs, hence producing a 20 to 40 times larger current for the sense amplifier. Consequently, there is a need for a writeback/regeneration cycle after the read operation.

Figure 5:
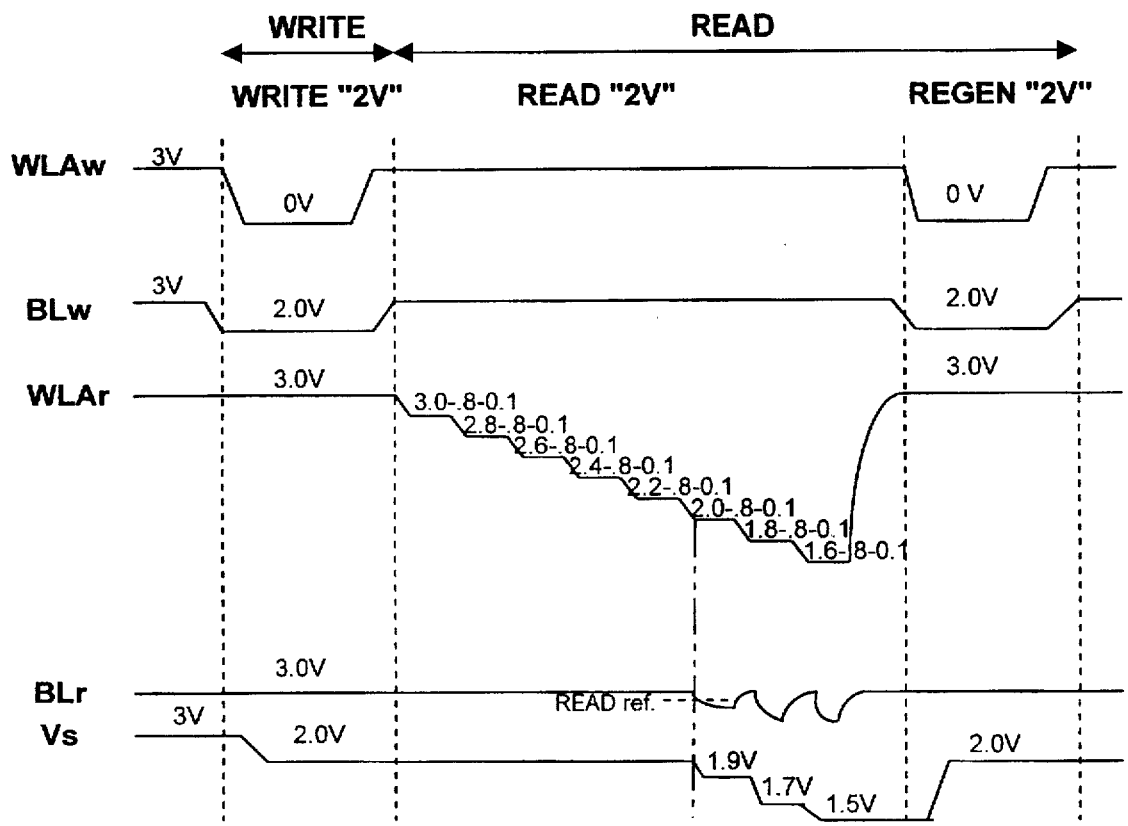
FIG. 5 is a timing diagram corresponding to FIG. 4.

The operation of the bipolar CMOS (BICMOS) gain cell of FIG. 4 is described in more detail through the operational waveforms of FIG. 5. During a write operation, cell A is selected by driving WLAw low. BLw is driven to a specified voltage corresponding to the binary code to be stored. For purpose of example, binary 010=2 volts is applied to BLw and is gated to the storage node, Vs through Tw. WLAw is then returned high to isolate the cell and BLw can restore high.

A read operation for this example occurs as follows: WLAr is sequenced toward ground and when the WLAr level reaches Vs−Vbe−0.1 volts (Vbe .≈0.8 volts), bipolar transistor Tr will conduct with 0.1 volts of overdrive and discharge bitline BLr by the charge stored in Cs multiplied by the value of Beta into WLAr. Because bitline conduction occurs at a unique WLAr voltage, this conduction can be sensed and used as a flag to gate out the binary value corresponding to Vs=2 volts. A shift register or decode circuit (e.g., output latch 70 (FIG. 1)) can be used to gate out a specific binary value corresponding to the time slot where bitline conduction occurred. After sequence operation is complete, a sense amplifier re-writes the original Vs value back onto BLw to regenerate the cell level during write back.

Thus, this invention provides a high gain multilevel storage cell wherein a specific storage voltage level is used to represent a binary value and a sequenced wordline, divided into N steps, is used to decode which binary value is stored. Differential voltage comparison at the sense amplifier is therefore avoided and moved to the cell level.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A method for multi-level storage in a gain cell comprising the steps of:
    a) storing a value of a multi-level signal in said gain cell;
    b) applying a stepping waveform to a source-drain connection of an output device of said gain cell;
    c) outputting a conduction signal, which is of a greater charge than said value of said multi-level signal, from said gain cell when a level of said stepping waveform corresponds to said value of said multi-level signal; and
    d) determining said value of said multi-level signal with said conduction signal and said level of said stepping waveform.

2. The method of claim 1, wherein step a) further comprises the step of:

activating an input device to write said value of said multi-level signal in said gain cell.

3. The method of claim 2, further comprising the step of: providing a field-effect transistor as said input device.

4. The method of claim 1, further comprising the step of: providing a level comparator as said output device.

5. The method of claim 4, further comprising the steps of:

providing a bipolar transistor as said level comparator; and outputting said conduction signal from said bipolar transistor when said level of said stepping waveform corresponds to said value of said multi-level signal.

6. The method of claim 4, further comprising the steps of:

providing a dual gate split-channel field-effect transistor as said level comparator; and outputting said conduction signal from said dual gate split-channel field-effect transistor when a read operation is indicated and when said level of said stepping waveform corresponds to said value of said multi-level signal.

7. The method of claim 6, wherein said dual gate split-channel field-effect transistor provides a nondestructive read-out of said gain cell.

8. The method of claim 1, wherein step d) further comprises the steps of:

d1) latching said level of said stepping waveform when said conduction signal occurs.

9. The method of claim 8, further comprising the step of:

d2) decoding the latched level of said stepping waveform into a binary output.

10. A gain cell circuit in a memory system comprising:

a storage device for storing a value of a multi-level signal in said gain cell;

an input device, coupled to said storage device, for inputting said value of said multi-level signal in said storage device; and a level comparator, coupled to said storage device, for receiving a stepping waveform at its source-drain connection, comparing a level of said stepping waveform to said value of said multi-level signal, and outputting a conduction signal greater in charge than said value of said multi-level signal when said level of said stepping waveform corresponds to said value of said multi-level signal.

11. The circuit of claim 10, wherein said storage device is a capacitor and said input device is a field-effect transistor.

12. The circuit of claim 11, wherein said level comparator is a bipolar transistor.

13. The circuit of claim 11, wherein said level comparator is a dual-gate split channel field-effect transistor having a source, a first gate, a second gate and a drain.

14. The circuit of claim 13, wherein said source of said split channel field-effect transistor receives said stepping waveform, said first gate is coupled to said storage device, said second gate is coupled to a read enable signal, and said drain outputs said conduction signal with a nondestructive read-out of said storage device.

15. An integrated memory and logic system for processing multi-level signals comprising:

a control logic device for generating a clock and said multi-level signals;

a stepping signal generator for receiving said clock and generating a stepping waveform;

a gain cell having a level comparator, coupled to said control logic device and said stepping signal generator, for storing a value of said multi-level signals, receiving said stepping waveform at a source-drain connection of said level comparator and outputting a conduction signal of a greater charge than said value of said multi-level signal when a level of said stepping waveform corresponds to said value of said multi-level signal; and an output device, coupled to said gain cell and said control logic device, for receiving said conduction signal, determining said level of said stepping waveform with said conduction signal, and outputting said value of said multi-level signal corresponding with said level of said stepping waveform.

16. The system of claim 15, wherein said gain cell comprises:

a storage device for storing a value of a multi-level signal in said gain cell;

an input device, coupled to said storage device, for inputting said value of said multi-level signal in said storage device; and a level comparator, coupled to said storage device, for receiving a stepping waveform, comparing a level of said stepping waveform to said value of said multi-level signal, and outputting said conduction signal when said level of said stepping waveform corresponds to said value of said multi-level signal.

17. The system of claim 15, wherein said output device comprises:

a counter, coupled to said control logic device, for receiving said clock and outputting a counter waveform corresponding to said stepping waveform; and a latch, coupled to said counter and said gain cell, for receiving said conduction signal and said counter waveform and latching said level of said counter waveform upon receipt of said conduction signal.

18. The system of claim 16, wherein said storage device is a capacitor, said input device is a field-effect transistor and said level comparator is a bipolar transistor.

19. The system of claim 16, wherein said storage device is a capacitor, said input device is a field-effect transistor and said level comparator is a dual-gate split channel field-effect transistor having a source, a first gate, a second gate and a drain.

20. The system of claim 19, wherein said source of said split channel field-effect transistor receives said stepping waveform, said first gate is coupled to said storage device, said second gate is coupled to a read enable signal, and said drain outputs said conduction signal with a nondestructive read-out of said storage device.

* * * * *